(12) United States Patent
Wilson

(10) Patent No.: US 8,031,551 B2
(45) Date of Patent: Oct. 4, 2011

(54) SYSTEMS, METHODS AND DEVICES FOR MONITORING CAPACITIVE ELEMENTS IN DEVICES STORING SENSITIVE DATA

(75) Inventor: Dean Clark Wilson, Lonsdale, MN (US)

(73) Assignee: Seagate Technology LLC, Scotts Valley, CA (US)

( * ) Notice: Subject to any disclaimer, the term of this patent is extended or adjusted under 35 U.S.C. 154(b) by 256 days.

(21) Appl. No.: 12/493,016

(22) Filed: Jun. 26, 2009

(65) Prior Publication Data

US 2010/0329064 A1 Dec. 30, 2010

(51) Int. Cl.
G11C 5/14 (2006.01)

(52) U.S. Cl. .................. 365/228; 365/226; 365/185.21; 365/196; 365/207

(58) Field of Classification Search .................. 365/226, 365/228, 185.21, 196, 207
See application file for complete search history.

(56) References Cited

U.S. PATENT DOCUMENTS

| | | | |
|---|---|---|---|
| 4,510,400 | A | 4/1985 | Kiteley |
| 5,367,489 | A | 11/1994 | Park et al. |
| 5,459,850 | A | 10/1995 | Clay et al. |
| 5,483,486 | A | 1/1996 | Javanifard et al. |
| 5,497,119 | A | 3/1996 | Tedrow et al. |
| 5,537,360 | A | 7/1996 | Jones et al. |
| 5,546,042 | A | 8/1996 | Tedrow et al. |
| 5,567,993 | A | 10/1996 | Jones et al. |
| 5,592,420 | A | 1/1997 | Cernea et al. |
| 5,914,542 | A | 6/1999 | Weimer et al. |
| 5,959,926 | A | 9/1999 | Jones et al. |
| 6,091,617 | A | 7/2000 | Moran |
| 6,404,647 | B1 | 6/2002 | Minne' |
| 6,567,261 | B2 | 5/2003 | Kanouda et al. |
| 6,700,352 | B1 | 3/2004 | Elliott et al. |
| 6,788,027 | B2 | 9/2004 | Malik |
| 6,838,923 | B2 | 1/2005 | Pearson |
| 6,981,161 | B2 | 12/2005 | Koo |
| 7,019,583 | B2 | 3/2006 | Del Signore, II et al. |
| 7,173,821 | B2 | 2/2007 | Coglitore |
| 7,177,222 | B2 | 2/2007 | Spengler |
| 7,233,890 | B2 | 6/2007 | Shapiro et al. |
| 7,268,998 | B2 | 9/2007 | Ewing et al. |

(Continued)

OTHER PUBLICATIONS

N. Li, J. Zhang, and Y. Zhong, "A Novel Charging Control Scheme for Super Capacitor Energy Storage in Photovoltaic Generation System," DRPT2008 Apr. 6-9, 2008 Nanjing China.

(Continued)

*Primary Examiner* — Jason Lappas
(74) *Attorney, Agent, or Firm* — Crawford Maunu PLLC

(57) ABSTRACT

Power-backup capabilities are provided by implementing a variety of different methods, systems and devices. According to one such implementation, a data storage device stores data in response to data accesses under the control of a memory control circuit. A solid-state memory circuit and a volatile caching memory circuit provide the memory control circuit with access to a set of common data. A power-reservoir circuit includes two or more capacitor cells that respectively hold charge to provide operating power to the data storage device to permit transfer of the data from the volatile memory circuit to the solid-state memory circuit in the event of a power loss. A detection circuit is connected to a center tap between the capacitor cells and uses the tap to detect characteristics of the cells relative to one another, and to provide an output that can be used to characterize the cells' electrical characteristics relative to one another.

20 Claims, 3 Drawing Sheets

U.S. PATENT DOCUMENTS

| | | | |
|---|---|---|---|
| 7,269,755 | B2 | 9/2007 | Moshayedi et al. |
| 7,305,572 | B1 | 12/2007 | Burroughs et al. |
| 7,310,707 | B2 | 12/2007 | Olds et al. |
| 7,318,121 | B2 | 1/2008 | Gaertner et al. |
| 7,321,521 | B2 | 1/2008 | Spengler |
| 7,334,144 | B1 | 2/2008 | Schlumberger |
| 7,404,073 | B2 | 7/2008 | Felts |
| 7,404,131 | B2 | 7/2008 | McCarthy et al. |
| 7,414,335 | B2 | 8/2008 | Hussein et al. |
| 7,487,391 | B2 | 2/2009 | Pecone et al. |
| 2006/0015683 | A1* | 1/2006 | Ashmore et al. ............. 711/113 |
| 2006/0080515 | A1 | 4/2006 | Spiers et al. |
| 2007/0223870 | A1 | 9/2007 | Farling et al. |
| 2008/0007219 | A1 | 1/2008 | Williams |
| 2008/0232144 | A1 | 9/2008 | Klein |
| 2009/0006877 | A1 | 1/2009 | Lubbers et al. |

OTHER PUBLICATIONS

ECNmag.com, "1.2A, 1.6MHz Synchronous Boost Regulator from Linear Technology," Top News, Jan. 8, 2009.

Intel® Mainstream SATA Solid State Drives, "Intel® X25-M and X18-M Mainstream SATA Solid-State Drives".

"Get the Lowdown on Ultracapacitors," Penton Media, Inc., Nov. 15, 2007.

STMicroelectronics, "Regulating Pulse Width Modulators, SG3524," Jul. 2000.

Linear Technology, "1.2A Synchronous Step-up DC/DC Converter with Input Current Limit, LTC3125," 2008.

* cited by examiner

SYSTEMS, METHODS AND DEVICES FOR MONITORING CAPACITIVE ELEMENTS IN DEVICES STORING SENSITIVE DATA

FIELD OF THE INVENTION

Aspects of the present invention relate to monitoring features that can be particularly useful for data storage applications in which data integrity is an issue.

BACKGROUND

Computer systems generally have several levels of memory; each level of memory can provide differing levels of speed, memory capacity, physical size, power requirements, voltage levels and/or volatility. These aspects are often at odds with each other. For example, increases in speed often lead to corresponding increases in power requirements. For this reason, many systems use a variety of different memories within the same system. From the view of the processor these memories are often hidden in the sense that common data is temporarily cached in smaller and faster memory circuits. This common data is mapped to larger and slower memory circuits, which are accessed when the faster memory does not contain the desired data. The common data, if changed in the cached memory, can eventually be written to the larger and slower memory circuits. This allows for the slow memory access time to be hidden so long as the faster memory contains the appropriately mapped data.

Computer systems generally contain some type of mass-storage memory that is able to store data when the computer system is powered down or when the memory otherwise loses power. This type of memory is referred to as nonvolatile memory because it is able to maintain data integrity when the computer system is not powered. Nonvolatile memory, however, can be slower by orders of magnitude relative to various volatile memories. Yet, nonvolatile can also be less expensive (per unit of memory capacity) and/or less power hungry.

A common type of nonvolatile mass-storage memory is a hard disc drive (HDD) that uses a rotating magnetic media. HDDs are used for home-computers, servers, enterprise applications and various other devices. Under normal operation a computer system transfers sensitive data from temporary memory to a HDD before the computer system is powered down. This allows for the sensitive data to be saved in memory that persists after the power is removed from the computer system. When the computer system is subsequently powered up, this data can be accessed and used by the computer system.

HDDs with rotating magnetic media have been in use for many years and have undergone various improvements including efficiency, reliability and memory capacity. Various applications, however, are beginning to use other types of nonvolatile memory with more frequency. Solid State Devices (SSDs) are one such alternative nonvolatile memory, and are attractive for many applications. Speed, cost and power requirements also factor into the selection of SSDs or HDDs.

While SSDs are useful in various applications, aspects of their operation and implementation remain challenging. For example, SSDs and other types of caching memory generally require some sort of backup energy source in order to perform backup functions for cached data. Providing such energy in an efficient, reliable and inexpensive manner has been challenging.

SUMMARY

The present invention is directed to systems and methods for use with power control features of data storage applications in which data integrity is an issue. These and other aspects of the present invention are exemplified in a number of illustrated implementations and applications, some of which are shown in the figures and characterized in the claims section that follows.

Consistent with an example embodiment of the present invention, a solid-state data storage device includes an energy storage circuit having two or more capacitive storage cells that respectively store power for powering the data storage device in the event of a power interruption. The capacitive storage cells are connected to one another by a center tap between the cells. A detection circuit detects characteristics of the capacitive storage cells, individually and/or relative to one another, via the center tap and outputs a signal representing the detected characteristics. The signal is used as an indication of the operational health of one or both of the capacitive storage cells.

According to another example embodiment of the present invention, a solid-state data storage device includes a non-volatile-type solid-state primary memory circuit, a volatile-type caching memory circuit and a memory controller. The primary memory circuit retains data integrity in the absence of operating power (i.e., as with non-volatile memory). The caching memory circuit is mapped to the primary memory circuit and provides the memory control circuit with access to a set of data representing a cached portion of memory that is mapped to the primary memory circuit. The memory controller is configured to control backup functions of the caching memory circuit in response to a power interruption. A backup power-reservoir circuit (e.g., energy storage circuit) that includes at least two capacitor cells connected by a center tap and that are configured to hold a charge to supply backup power for powering backup functions of the data storage device in response to a power failure. A detection circuit, which is connected to the center tap, detects electrical characteristics of each of the capacitor cells via the tap, and outputs a representation of the detected electrical characteristics.

Other embodiments are directed to methods for implementing the above functions, data storage systems (e.g., servers or stand-alone computers) that implement one or more of the data storage/memory devices as described herein, and other circuits that store data.

The above summary is not intended to describe each illustrated embodiment or every implementation of the present invention. The figures and detailed description that follow, including that described in the appended claims, more particularly exemplify these embodiments.

BRIEF DESCRIPTION OF THE DRAWINGS

The invention may be more completely understood in consideration of the detailed description of various embodiments of the invention that follows in connection with the accompanying drawings as follows.

Figure 1:
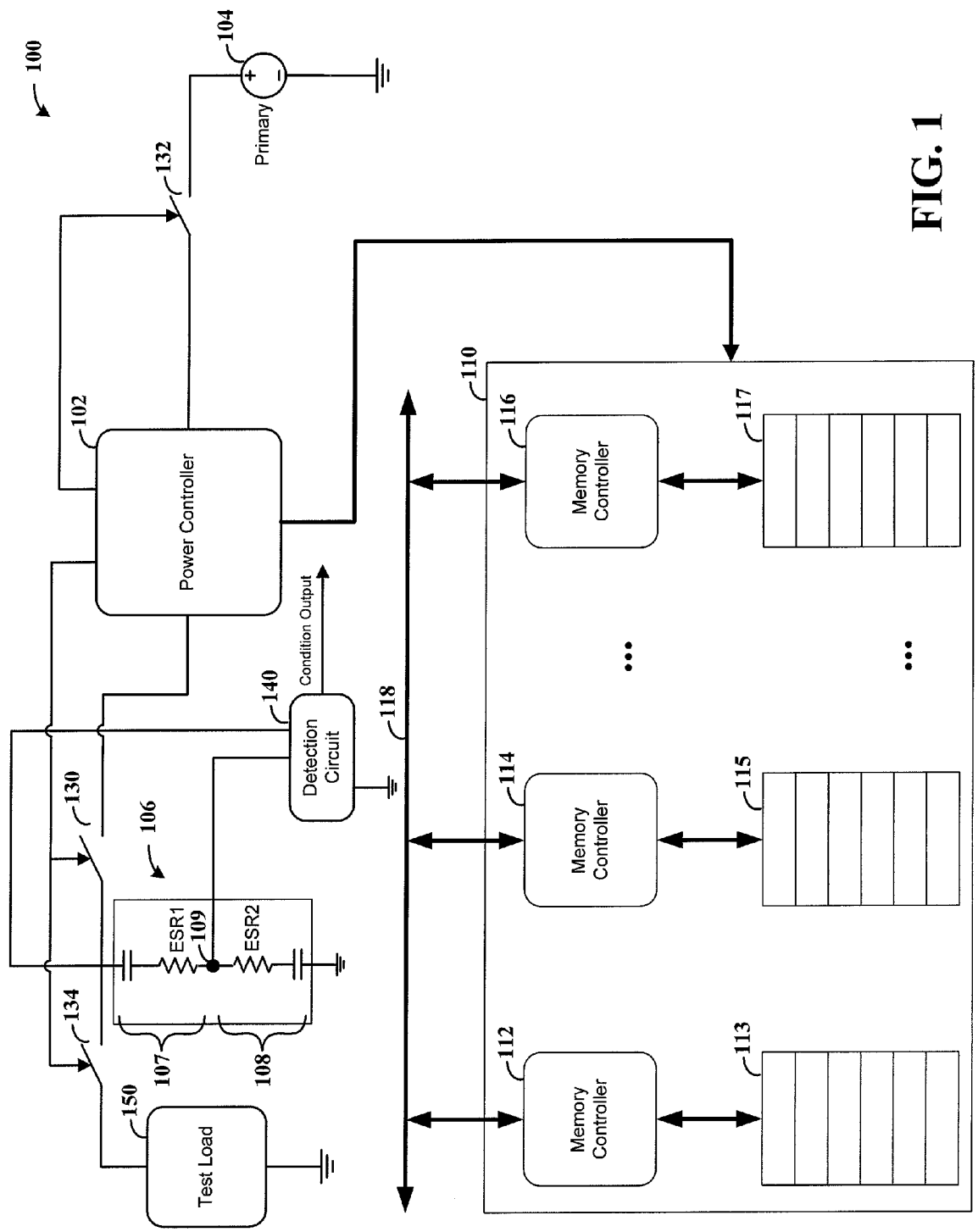
FIG. 1 shows a system diagram for a SSD-type data storage system with a capacitive power reservoir circuit, according to an example embodiment of the present invention.

While the invention is amenable to various modifications and alternative forms, specifics thereof have been shown by way of example in the drawings and will be described in detail. It should be understood, however, that the intention is not to limit the invention to the particular embodiments described. On the contrary, the intention is to cover all modifications, equivalents, and alternatives falling within the spirit and scope of the invention.

DETAILED DESCRIPTION

Aspects of the present invention are believed to be useful for monitoring of capacitive elements in data storage devices, circuits and systems. A particular application of the present invention relates to solid state devices (SSDs) that provide nonvolatile memory storage. While the present invention is not necessarily limited to such applications, various aspects of the invention may be appreciated through a discussion of various examples using this context.

According to an embodiment of the present invention, a data storage system includes a memory controller, a nonvolatile-type primary memory that stores data and retains the stored data in the absence of power, and a volatile-type caching memory that temporarily stores data for rapid access by the memory controller. A backup power-reservoir (energy storage) circuit stores capacitive energy and provides that energy for performing backup functions with the cache in response to a power interruption. A test/monitoring circuit is used to monitor relative characteristics, such as relative capacitance and/or equivalent series resistance, of capacitor cells in the backup power-reservoir circuit, and generates an output that characterizes the ability of the power-reservoir circuit to store energy. Relative variances in these electrical characteristics such as those pertaining to variances over time, variances between the capacitor cells or variances relative to a threshold, are reflected in the output as a condition of the health of the respective capacitor cells.

In connection with various embodiments, the test/monitoring circuit monitors the backup power-reservoir circuit to detect its ability to provide energy for powering backup functions, to ensure that enough energy is present to power devices for a sufficient time period (e.g., several milliseconds of hold-up time) in the event of a power loss to ensure that all data is flushed from the cache and written to the nonvolatile memory. Such power-providing capabilities can be measured as a function of a charge depletion period, during which the power-reservoir circuit should be capable of providing an amount of power/voltage sufficient to operate the memory of a SSD. To assess this ability, electrical characteristics of respective capacitor cells in the power-reservoir circuit are detected and used to determine the respective health of one or more of the capacitor cells. In one implementation, the capacitance of the capacitor cells is compared and any mismatch is used as an indication that one of the cells is not operating properly. In another implementation, the equivalent series resistance (ESR) of the capacitor cells is compared and any mismatch in ESR is used as an indication that one of the cells is not operating properly. Other implementations involve comparisons of both capacitance and ESR, while others involve the comparison of additional electrical characteristics.

In some embodiments, the test-monitoring circuit compares detected electrical characteristics from one or more of the capacitor cells in the backup power-reservoir circuit to a threshold or other value that may or may not be relevant to another one of the capacitor cells. For example, where a power-reservoir circuit includes two capacitor cells, electrical characteristics of one or both of the cells can be compared to a predefined threshold characteristic or a characteristic range, such as a range of capacitance of ESR values, to determine that the capacitor cell is malfunctioning when the detected characteristic is not within the predefined range. This comparison may be done separately from and/or in addition to the comparison of electrical characteristics of different capacitor cells.

In other embodiments, the test-monitoring circuit monitors electrical characteristics of each of the capacitor cells and stores data in the non-volatile type primary memory to characterize the electrical characteristics. The test-monitoring circuit uses the stored data to automatically characterize the health of the capacitor cells using time-based variations as reflected in the stored data. For instance, by monitoring trends or other variations in the electrical characteristics of a particular capacitor cell, the health of the cell can be determined such as by detected degradation in the cell. Similarly, trends or other variations in a relative comparison between cells can be monitored over time. For example, the detected capacitance of one cell as relative to another cell can be stored and monitored, with any change in the relative capacitance (i.e., a mismatch between cells) used as an indication of a change in cell characteristics and, if applicable, a failure.

These and other embodiments may be implemented in connection with and/or are otherwise represented in various figures. Accordingly, the following discussion of the Figures and the embodiments shown therein represent exemplary implementations of various embodiments, which may be implemented in connection with one or more approaches as described above, in connection with other figures and/or in the claims section that follows. Many different combinations of memory circuits, power supplies, control circuits and other device/system circuits may be used in accordance with various aspects of the present invention, and may involve one or more of the systems and/or approaches as shown in the figures. In addition, various discussion refers to "memory" and/or "data storage," where one or both terms may refer to similar or the same types of devices and systems, as well understood in the relevant art.

FIG. 1 shows an SSD-type data storage system 100 including a capacitive power-reservoir circuit 106, according to an example embodiment of the present invention. The system 100 includes a power controller 102 that routes power from a primary power source 104 under normal operating conditions, and from the power-reservoir circuit 106 in the event of a power interruption, to a data storage circuit arrangement 110. The data storage circuit arrangement 110 includes one or more respective non-volatile/cache memory combinations each having its own memory controller. Accordingly, memory controllers 112, 114 and 116 are shown by way of example, each respectively coupled to data storage circuits 113, 115 and 117 that each include a non-volatile type of memory and a (volatile) cache. The data storage circuits are coupled to a bus 118 for read and write operations.

The capacitive power-reservoir circuit 106 includes capacitor cells 107 and 108, each having a capacitor circuit that stores charge for use in response to a power interruption. The cells 107 and 108 are coupled at a center tap 109, and charged with power from the primary power source 104 as routed by the power controller 102 via the control of switch 130.

A detection circuit 140 is coupled to the center tap 109 and is configured to detect respective electrical characteristic of each of the cells 107 and 108, and further to generate an output representing the detected characteristics. In this regard, the detection circuit 140 may detect characteristics of one of the cells as relative to similar characteristics of the other one of the cells (e.g., to detect a mismatch indicative of a failure or degradation of one of the cells), or may separately detect characteristics of each of the cells. For instance, the voltage across the center tap 109 and ground can be used to characterize the cell 108, and the voltage across the center tap 109 and the incoming power can be used to characterize the cell 107. This characterization may be based upon capacitance, equivalent series resistance or other electrical characteristics and used in one or more manners (e.g., as described above) by the detection circuit 140 to detect or otherwise identify an operational characteristic of one or both of the cells 107 and 108.

The condition output generated by the detection circuit 140 is used in one or more of a variety of manners. In some applications, the output is used to alert a user about an impending or actual failure condition, in response to which the user can take action such as by replacing the power-reservoir circuit and/or a larger data storage circuit including the power-reservoir circuit. In other applications, the output is stored via one of the memory controllers 112, 114 and 116 and used for future reference, such as to monitor the detected characteristics over time.

In other embodiments, the output from the detection circuit is used to configure the system 100 in response to detected cell characteristics. In some implementations, the output is provided to the power controller 102, which is configured to control the charge applied to the power-reservoir circuit 106 in response to the output (e.g., to increase the charge to compensate for a degrading capacitor cell). In other implementations, the power controller receives the output and is configured to further isolate the cells via controllable switches (not shown), such as by connecting the center tap 109 to the power supply 104 or to ground, respectively isolating the cells 107 or 108. In still other implementations, two or more of the power-reservoir circuits 106 are used (e.g., as shown in FIG. 2), and the power controller uses the output and switches to decouple failed power-reservoir circuits by disconnecting the circuits.

The system 100 optionally includes a test load circuit 150 that is used to test the ability of the power-reservoir circuit 106 to hold charge for powering backup functions of the data storage system 100. The power controller 102 couples the test load to the power-reservoir circuit 106 via switch 134, and the detection circuit 140 detects electrical characteristics of the cells 107 and 108 via the center tap 109, in one or more manners such as described above.

Figure 2:
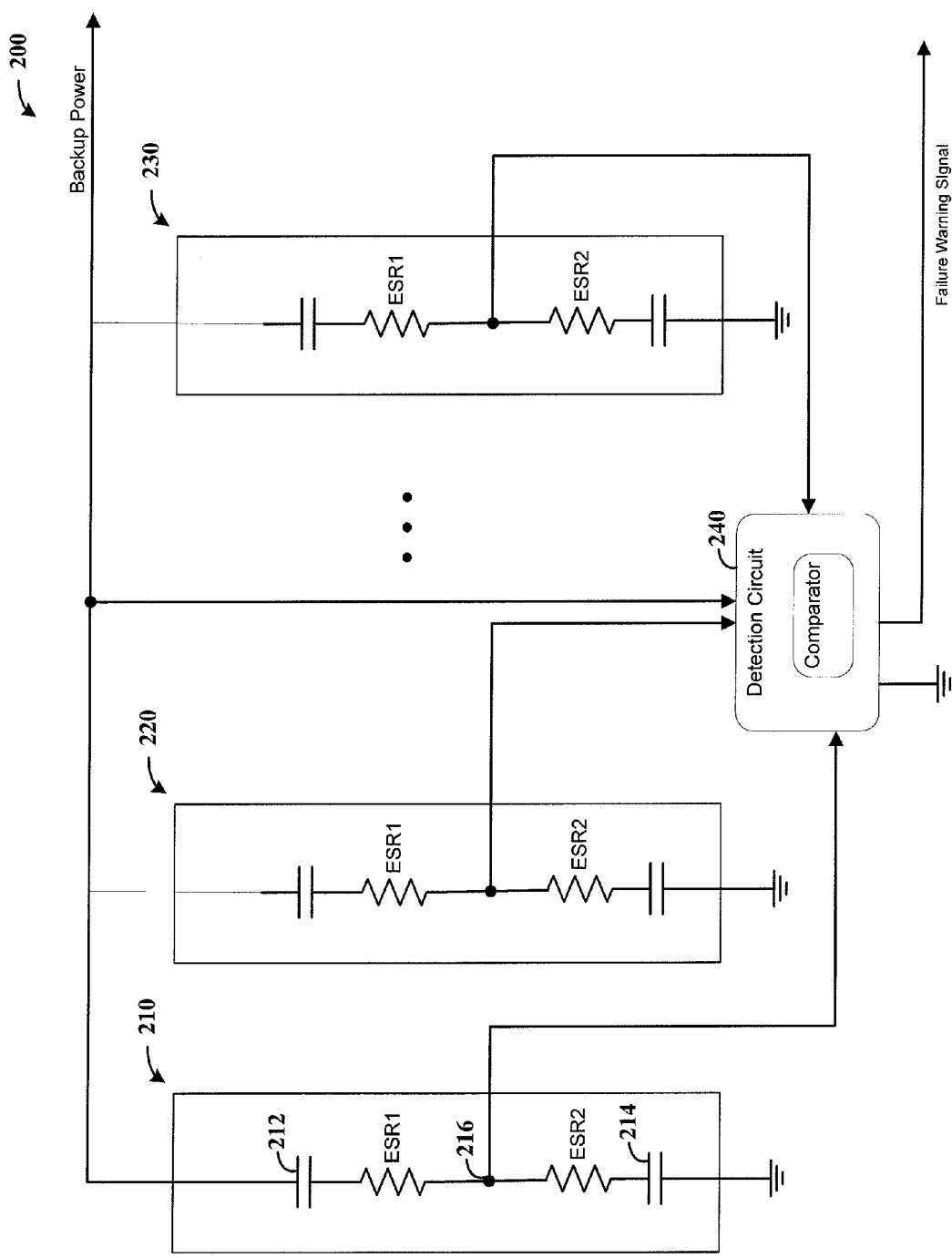
FIG. 2 shows a backup power-reservoir system, according to another example embodiment of the present invention.

FIG. 2 shows a backup power-reservoir system 200, according to another example embodiment of the present invention. As discussed above, the system 200 can be implemented with the system 100 shown in FIG. 1 (or other systems), and includes multiple power-reservoir circuits with circuits 210, 220 and 230 shown by way of example.

A detection circuit 240 is coupled to each of the power-reservoir circuits 210-230 for detecting characteristics of capacitor cells in each circuit. Generally, the detection circuit 240 is connected to a center tap of each of the power-reservoir circuits 210-230, and to nodes across each power-reservoir circuit. Using power-reservoir circuit 210 by way of example, the detection circuit 240 uses center tap 216 to detect characteristics of capacitor circuits (cells) 212 and 214. Each of the power-reservoir circuits 210-230 is effectively coupled via positive and negative terminals (upper and lower connections to each cell), plus a third (center tap) terminal connecting capacitor cells within each circuit. Measurements across two or more of these terminals can be used to characterize the respective capacitor cells.

In some implementations, the detection circuit 240 includes a comparator 242 that compares electrical characteristics (capacitance, ESR) of the cells 212 and 214 and generates an output based upon detecting a mismatch in the electrical characteristics. The comparator may further use threshold-type data that is indicative of a threshold mismatch or other value upon which a failure-type condition can be discovered and used in generating the output.

Figure 3:
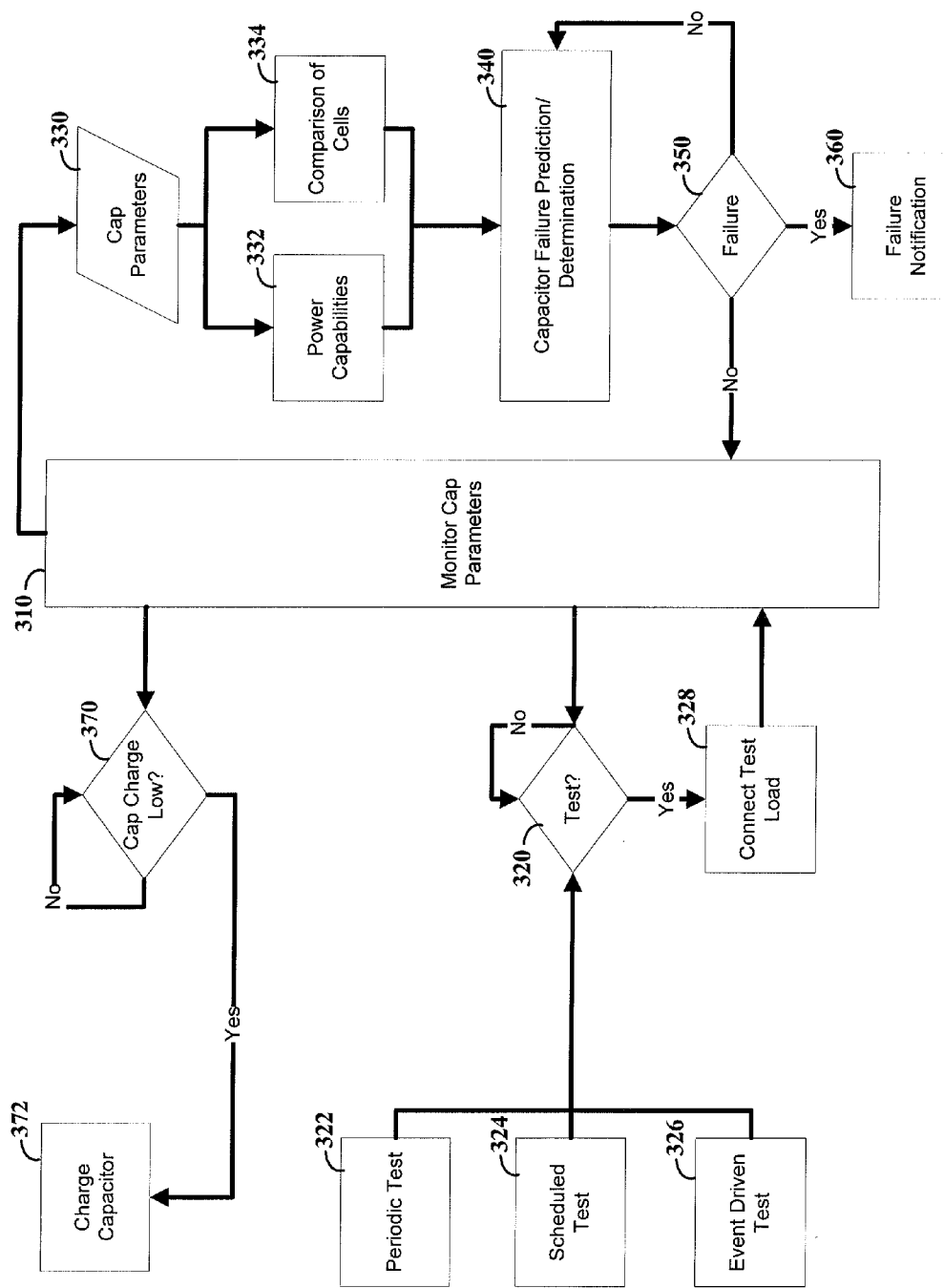
FIG. 3 shows a data-flow diagram for operating a SSD-type data storage device, in accordance with other example embodiments of the present invention.

FIG. 3 shows a data-flow diagram for operating a SSD-type data storage device, in accordance with other example embodiments of the present invention. At block 310, a capacitor-based power-reservoir circuit is monitored for testing as well as other operational characteristics. Generally, the monitoring involves detecting an electrical characteristic at a tap located between individual capacitor-type cells in the power reservoir circuit, such as described above. For testing the power-reservoir circuit, a test is initiated at block 320, either internal to the block 310 or at an external source, with external sources 322, 324 and 326 respectively shown by way of example as pertaining to periodic, scheduled or event-driven tests (e.g., in response to another detected condition or a predefined event such as a timing-related or operationally-related event).

If a test cycle is initiated, a test load is connected at block 328, parameters of the power-reservoir circuit are monitored at block 310, and the monitored parameters are reported out at block 330. These parameters are used to assess the power-reservoir circuit, such as by detecting power-providing capabilities of a capacitor cell as shown at block 332 (e.g., by detecting a drop in capacitance over time while powering a load), or by comparing the parameters with another capacitor cell at block 334.

At block 340, the parameters and assessment is used to predict or determine a failure condition of the power-reservoir circuit. The failure condition may pertain to different operational type functions or characteristics of the power-reservoir circuit, such as those relating to a drop in performance, the failure to meet a performance threshold, or a failure to perform as needed. If a failure condition exists at block 350, a failure notification is sent at block 360, and can be in the form of a visual or electronic indicator. If a failure condition does not exist at block 350, the process returns to monitoring as at block 310.

As discussed above, other monitoring functions can be performed at block 310, which may include monitoring a power-reservoir circuit and/or a capacitor cell therein to determine whether the charge on the circuit or cell is low. If the capacitor charge is low at block 370, the capacitor is charged at block 372. This charging may, for example, be carried out prior to testing as initiated at 320, or otherwise during operation.

The various embodiments described above are provided by way of illustration only and should not be construed to limit the invention. Based on the above discussion and illustrations, those skilled in the art will readily recognize that various modifications and changes may be made to the present invention without strictly following the exemplary embodiments and applications illustrated and described herein. For instance, such changes may include using different types of detection circuits, different comparisons for determining the health of a particular power-reservoir circuit, and different arrangements of energy storage circuits, such as power-reservoir circuits, and the corresponding data storage/memory devices that are being powered. Such modifications and changes do not depart from the true spirit and scope of the present invention, which is set forth in the following claims.

What is claimed is:

1. A solid-state data storage device comprising:
    a memory controller configured to control memory backup functions of the data storage device in response to a power interruption;

a nonvolatile-type solid-state primary memory circuit configured and arranged to retain data integrity in the absence of operating power;

a volatile-type caching memory circuit mapped to the primary memory circuit and configured and arranged to provide the memory controller with access to a set of data representing a cached portion of memory that is mapped to the primary memory circuit;

a backup power-reservoir circuit including at least two capacitor cells connected by a center tap and configured to hold a charge to supply backup power for powering backup functions of the data storage device in response to a power failure; and a detection circuit connected to the center tap and configured and arranged to detect electrical characteristics of each of the capacitor cells via the tap, and to output a representation of the detected electrical characteristics.

2. The device of claim 1, wherein the detection circuit is configured and arranged to detect electrical characteristics of each one of the capacitor cells as relative to another one of the capacitor cells, and to output a representation of the detected relative electrical characteristics.

3. The device of claim 1, wherein the detection circuit is configured and arranged to detect electrical characteristics of each one of the capacitor cells as relative to another one of the capacitor cells, and to output data characterizing a difference in the electrical characteristics of one of the cells relative to another one of the cells.

4. The device of claim 1, wherein the detection circuit is configured and arranged to compare detected electrical characteristics of each of the capacitor cells with a threshold value and to output a representation of the detected electrical characteristics of each of the capacitor cells by outputting an error signal in response to the detected electrical characteristics of one of the capacitor cells exceeding the threshold value.

5. The device of claim 1, wherein the detection circuit is configured and arranged to store detected electrical characteristics of each of the capacitor cells in the primary memory circuit, to monitor variations in the electrical characteristics of each of the capacitor cells over time using the stored characteristics, and to output a representation of the detected electrical characteristics of each of the capacitor cells by outputting an error signal in response to the monitored variations in the electrical characteristics.

6. The device of claim 1, further including a power-reservoir controller circuit configured to charge the backup power-reservoir circuit to a charge level that is set in response to the output.

7. The device of claim 1, further including a power-reservoir controller circuit configured to increase the voltage applied to charge the backup power-reservoir circuit to a voltage level that is set in response to the output.

8. The device of claim 1, further including
another backup power-reservoir circuit including at least two capacitor cells connected by a center tap and that is connected to supply power for powering the backup functions of the data storage device in response to a power failure, wherein the detection circuit is connected to the center tap of the other backup power-reservoir circuit and configured and arranged to detect electrical characteristics of each of the capacitor cells via the tap, and to output a representation of the detected electrical characteristics, and a power-reservoir controller circuit configured to increase the voltage applied to charge one of the backup power-reservoir circuits in response to the output indicating that the capacitor cells in the other one of the backup power-reservoir circuits exhibit different electrical characteristics.

9. The device of claim 1, wherein the detection circuit is configured and arranged to detect a mismatch in capacitance between the respective capacitor cells and to output a representation of the detected electrical characteristics by outputting an error signal in response to the mismatch.

10. The device of claim 1, wherein the detection circuit is configured and arranged to detect a mismatch in equivalent series resistance (ESR) of the capacitor cells relative to one another via the tap and to output a representation of the detected electrical characteristics by outputting an error signal in response to the mismatch.

11. The device of claim 1, wherein
the at least two capacitor cells are connected in series between terminals, and
the detection circuit is configured and arranged to detect characteristics of each of the capacitor cells via the tap by detecting the voltage across one of the terminals and the tap, and by detecting the voltage across the other one of the terminals and the tap.

12. The device of claim 1, wherein the detection circuit is configured and arranged to detect electrical characteristics of each of the capacitor cells via the tap by discharging a portion of the charge in the power-reservoir circuit while detecting voltage on the center tap.

13. The device of claim 1, wherein the detection circuit is configured and arranged to detect electrical characteristics of the capacitor cells via the tap during a start-up period in which the power-reservoir circuit is initially charged.

14. The device of claim 1, wherein the detection circuit determines capacitive storage characteristics of each cell by comparing a detected mismatch in capacitance between the capacitor cells with a threshold capacitance mismatch, and outputs a representation of the detected electrical characteristics by outputting a signal indicating a failure condition in response to the detected mismatch in capacitance exceeding the threshold.

15. The device of claim 1, wherein the test detection circuit is configured and arranged to determine capacitive storage characteristics that indicate degradation of a charge depletion period of the power-reservoir circuit and to output a representation of the detected electrical characteristics by outputting an error signal in response to the indicated degradation exceeding a threshold beyond which the capacitive storage detection circuit is unable to store sufficient charge to hold-up the operation of the data storage device during backup functions following a power loss.

16. The device of claim 1, further including an isolation circuit configured to electrically isolate one of the capacitor cells in response to the output indicating that the one of the capacitor cells is malfunctioning.

17. A monitoring and control circuit for a solid-state data storage device, the circuit comprising:
a power reservoir circuit including two capacitors that are coupled in series by a center tap and that are configured to hold a charge to supply backup power;
a memory controller configured to control backup functions of a volatile-type caching memory circuit, by accessing a set of data representing a cached portion of memory and storing the accessed set of data in a nonvolatile-type solid-state primary memory circuit in response to a power interruption, using the charge held in the power reservoir circuit as power for executing the backup functions; and a detection circuit that is configured and arranged to detect electrical characteristics of each of the capacitor cells via the tap, and to output a representation of the detected electrical characteristics.

18. The circuit of claim 17, wherein the detection circuit is configured and arranged to compare electrical characteristics of the capacitors to one another, and to output the representation in response to a mismatch between the compared electrical characteristics.

19. The circuit of claim 17, wherein the detection circuit is configured and arranged to detect electrical characteristics of each of the capacitor cells via the tap by discharging a portion of the charge in the power-reservoir circuit while detecting voltage on the center tap.

20. A method for operating a solid-state data storage device including a nonvolatile-type solid-state primary memory circuit configured and arranged to retain data integrity in the absence of operating power, and a volatile-type caching memory circuit mapped to the primary memory circuit and configured and arranged to provide access to a set of data representing a cached portion of memory that is mapped to the primary memory circuit, the method comprising:

controlling backup functions of the data storage device in response to a power interruption;

storing, in a backup power-reservoir circuit including at least two capacitor cells connected by a center tap, a charge to supply backup power for powering the controlled backup functions of the data storage device in response to a power failure;

detecting, via the center tap, electrical characteristics of each of the capacitor cells via the tap relative to another one of the capacitor cells;

outputting a representation of the detected relative electrical characteristics; and using the representation to detect a failure condition of the data storage device.

\* \* \* \* \*